(12) United States Patent
Grodzki

(10) Patent No.: US 9,506,998 B2
(45) Date of Patent: Nov. 29, 2016

(54) METHOD AND MAGNETIC RESONANCE APPARATUS TO GENERATE RAW DATA SETS FROM DOUBLE ECHO DATA ACQUISITIONS

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 609 days.

(21) Appl. No.: 14/068,202

(22) Filed: Oct. 31, 2013

(65) Prior Publication Data

US 2014/0117985 A1    May 1, 2014

(30) Foreign Application Priority Data

Oct. 31, 2012    (DE) .................. 10 2012 219 920

(51) Int. Cl.
*G01R 33/48*    (2006.01)
*G01R 33/561*    (2006.01)

(52) U.S. Cl.
CPC ....... *G01R 33/4816* (2013.01); *G01R 33/5616* (2013.01); *G01R 33/5611* (2013.01)

(58) Field of Classification Search
CPC .......... G01R 33/4816; G01R 33/5616; G01R 33/5611
See application file for complete search history.

(56) References Cited

U.S. PATENT DOCUMENTS

| | | | |
|---|---|---|---|
| 7,917,189 B2* | 3/2011 | Mistretta | A61B 5/055 324/307 |
| 8,072,215 B2* | 12/2011 | Fuderer | G01R 33/5615 324/309 |
| 8,854,040 B2* | 10/2014 | Kannengiesser | G01R 33/5611 324/309 |
| 2008/0154117 A1 | 6/2008 | Nielles-Vallespin | |
| 2008/0238421 A1 | 10/2008 | Kitane et al. | |
| 2010/0171496 A1 | 7/2010 | Park et al. | |
| 2010/0237864 A1 | 9/2010 | Stemmer | |
| 2011/0215804 A1 | 9/2011 | Deimling et al. | |
| 2011/0267053 A1 | 11/2011 | Li et al. | |
| 2011/0267054 A1 | 11/2011 | He et al. | |
| 2011/0288399 A1 | 11/2011 | Herzka et al. | |

FOREIGN PATENT DOCUMENTS

| JP | H116820 A | 1/1999 |
|---|---|---|
| JP | 2001327480 A | 11/2001 |

OTHER PUBLICATIONS

Heid et al., "Rapid Single Point (RASP) Imaging," SMR, 3rd Annual Meeting, p. 684 (1995).
Zhang et al., "Real-Time Tracking and Visualization of Regional Lung Motion with Dual Gradient Echo Acquisition," Proc. Intl. Soc. Mag. Reson. Med., vol. 15, pp. 2770 (2007).

(Continued)

*Primary Examiner* — Gregory H Curran
(74) *Attorney, Agent, or Firm* — Schiff Hardin LLP

(57) ABSTRACT

In a method and magnetic resonance apparatus to create two raw data sets from double echo exposures of an imaging area located in a measurement volume of the magnetic resonance system, two echo signals are acquired in the form of raw data sets at different times, and k-space corresponding to the imaging area is either scanned completely only for the first raw data set and incompletely for the second raw data set, or is scanned completely only for the second raw data set and incompletely for the first raw data set. The completion of the incomplete raw data set takes place using a model that is based on the completely scanned raw data set.

10 Claims, 2 Drawing Sheets

(56) References Cited

OTHER PUBLICATIONS

Qu et al., "Convergence Behavior of Iterative SENSE Reconstruction with Non-Cartesian Trajectories," Magnetic Resonance in Medicine, vol. 54, pp. 1040-1045 (2005).

Magland et al., "Fast Low-Angle Dual Spin-Echo (FLADE): A New Robust Pulse Sequence for Structural Imaging of Trabecular Bone," Magnetic Resonance in Medicine, vol. 55, pp. 465-471 (2006).

* cited by examiner

METHOD AND MAGNETIC RESONANCE APPARATUS TO GENERATE RAW DATA SETS FROM DOUBLE ECHO DATA ACQUISITIONS

BACKGROUND OF THE INVENTION

Field of the Invention

The present invention concerns a method to generate raw data sets from double echo exposures (data acquisitions) with a magnetic resonance system, as the execution of such a method; and a magnetic resonance system for this.

Description of the Prior Art

New fields of application in magnetic resonance tomography are offered by the acquisition of magnetic resonance data (MR data) with very short echo times TE (for example TE<500 μs). It is thereby possible to depict substances or tissue that cannot be shown by means of conventional sequences—for example a (T)SE ((Turbo) Spin Echo) sequence or a GRE (Gradient Echo) sequence—since their T2 time (the relaxation of the transverse magnetization of this substance or tissue) is markedly shorter than the echo time, and thus a corresponding signal from these substances or tissues has already decayed at the point in time of acquisition. For example, with echo times that are in the range of the corresponding decay time, it is possible to depict bones, teeth or ice in an MR image, even though the T2 time of these objects is in a range of 30-80 μs.

One approach to enable short echo times is to scan (enter raw MR data into) k-space at respective data entry points by detection of the free induction decay (FID). Such a method is also designated as single point imaging since essentially only one raw data point in k-space is detected per RF excitation. One example of such a method for single point imaging is the RASP method ("Rapid Signal Point (RASP) Imaging", O. Heid, M. Deimling, SMR, 3rd Annual Meeting, Page 684, 1995). According to the RASP method, a raw data point in k-space whose phase has been coded by gradients is read out at a fixed point in time after the RF excitation relative to the echo time TE. The gradients are modified by the magnetic resonance system for each raw data point or measurement point, and k-space is thus scanned point by point.

To create an image that depicts only substances or tissue which have a very short T2 time (such as bones), it is typical to implement the RASP method twice, for example, with the RASP method operating with such a short echo time TE in the first pass that the bones (for example) still supply a signal, and with the RASP method operating with a correspondingly longer echo time TE in the second pass, so that the bones no longer deliver a signal. Each pass of the RASP method respectively delivers an image, wherein the two images created in such a manner are subtracted from one another so that only tissues or substances that have a very short T2 time are still shown in the resulting difference image.

SUMMARY OF THE INVENTION

An object of the present invention is to optimize the measurement time of double echo measurements with very short echo times, and thus the total measurement time needed to acquire image data sets with a magnetic resonance system.

In the following, the achievement of the object according to the invention is described in relation to the inventive method. Features, advantages and alternative embodiments that are mentioned are likewise applicable to the inventive apparatus and the computer-readable data storage medium, and vice versa. Functional features of the method can be implemented by corresponding object modules, in particular by hardware modules, and/or software modules.

The invention uses a model, for completion of an undersampled raw data set, that is generated on the basis of a completely scanned raw data set, in order to markedly reduce the measurement time of double echo measurements with very short echo times.

In the method according to the invention two raw data sets are acquired from double echo exposures of an imaging area located in a measurement volume of a magnetic resonance system, by operation of the magnetic resonance system. The method includes the following steps:

a) radiate an RF excitation pulse with an RF transmission/reception device of the magnetic resonance system, b) after a first time period following the radiated excitation pulse, acquire a first echo signal with the RF transmission/reception device, and store the first echo signal in the form of a first raw data set, c) acquire a second echo signal after a second time period (that is not equal to the first time period) following the radiated excitation pulse with the RF transmission/reception device, and store the second echo signal in the form of a second raw data set, d) repeat steps a) through c) while switching (activating) different gradients for spatial coding with the gradient field system of the magnetic resonance system such that, after a maximum number of repetitions corresponding to a termination criterion, k-space corresponding to the imaging area is either scanned completely for the first raw data set and incompletely for the second raw data set, or is scanned completely for the second raw data set and incompletely for the first raw data set, and complete the incomplete raw data set in a computerized evaluation device of the magnetic resonance system, using a model generated on the basis of the complete raw data set.

By the repetition of steps a) through c) according to the invention using the termination criterion stated above, it is sufficient to completely scan only one of the two raw data sets. This then serves as a basis for the completion of the incompletely scanned raw data set.

The measurement time of double echo measurements with very short echo times can be markedly reduced because such methods (also known as compressed sensing) are integrated into the process for providing image data sets.

In a preferred embodiment, a respective image data set is reconstructed from the already-complete raw data set and the completed raw data set. The time until an image can be reconstructed from the respective raw data set is also reduced by reducing the measurement time of the entire double echo measurement.

In an embodiment, a difference image is calculated from the two reconstructed image data sets. Because signals from nearly all substances and tissues (including bones, teeth and ice) are included in the results that are acquired in the first scanning process, only signals of substances and tissues that have a correspondingly long T2 time are included in the results that are acquired in the second scanning process. Therefore, the difference image includes only those substances and tissues that have such a short T2 time that they are no longer included in the second image. For example, it is possible for only bones to still be shown in the difference image. For this purpose, it is sufficient, for example, for the second scan to occur somewhat more than 400 μs after the RF excitation pulse (thus with an echo time of 400 μs), since the signal of bones has already decayed after this time (400 μs).

An embodiment according to the invention includes implementing a weighting in the calculation of the difference image, the weighting depending on a time constant prevailing in the imaging area.

In another exemplary embodiment, k-space corresponding to the imaging area is either scanned completely for the first raw data set and only half of k-space is scanned for the second raw data set, or is scanned completely for the second raw data set and only half of k-space is scanned for the first raw data set. In this way the number of repetitions (and therefore the measurement time) can be reduced by up to 50%.

In another exemplary embodiment, the time TE1 that extends after the last radiated excitation pulse until the acquisition of the echo signals is started is equal to the minimum switching time between a transmission mode and a reception mode of the RF transmission/reception device. In the present method, the echo time TE1 is thus downwardly limited only by a hardware constant.

In a further embodiment, after the acquisition of the first echo signal data set, the polarities of the gradients ($G_x$, $G_y$, $G_z$) are flipped, and after this the second echo signal data set is acquired.

In a further embodiment, k-space corresponding to the imaging area is scanned along a radial trajectory in a quadrant of k-space for the first raw data set and along a radial trajectory through the entirety of k-space for the second raw data set.

The scope of the present invention also encompasses a magnetic resonance system for the creation of two raw data sets from double echo exposures. The magnetic resonance system has a data acquisition unit (scanner) with a magnet unit to generate a basic magnetic field and a gradient system to generate a gradient field in the measurement volume, a control unit that operates the data acquisition unit, a transmission/reception device to detect echo signals and to emit RF excitation pulses; and an evaluation device to evaluate the signals and create the two raw data sets.

The control unit is configured to operate the data acquisition unit to scan k-space corresponding to the imaging area and to implement the following steps:

a) radiate an RF excitation pulse by means of an RF transmission/reception device of the magnetic resonance system, b) acquire a first echo signal after a first time after the radiated excitation pulse by means of the RF transmission/reception device, and store the first echo signal in the form of a first raw data set, c) acquire a second echo signal after a second time (that is not equal to the first time) after the radiated excitation pulse by means of the RF transmission/reception device, and store the second echo signal in the form of a second raw data set, d) repeat steps a) through c) while switching different gradients for spatial coding by means of a gradient field system of the magnetic resonance system, such that, after a maximum number of repetitions corresponding to a termination criterion, k-space corresponding to the imaging area is either scanned completely for the first raw data set and incompletely for the second raw data set or is scanned completely for the second raw data set and incompletely for the first raw data set.

The evaluation device is configured to complete the incomplete raw data set, with the completion taking place using a model based on the complete raw data set.

The present invention also encompasses a non-transitory, computer-readable data storage medium encoded with programming instructions that, when the storage medium is loaded into a computerized control and evaluation system of a magnetic resonance apparatus, cause the magnetic resonance apparatus to execute one or more of the embodiments of the method according to the invention described above.

The computer-readable data storage medium can be, for example a DVD, a magnetic tape or a USB stick on which is stored electronically readable control information, in particular software. When this control information is read from the data medium and stored in a controller or computer of a magnetic resonance system, all embodiments of the method according to the invention that is described in the preceding can be executed.

The advantages of the magnetic resonance system according to the invention and the computer-readable storage medium according to the invention essentially correspond to the advantages of the method according to the invention that are described in detail above.

DESCRIPTION OF THE PREFERRED EMBODIMENTS

Figure 1:
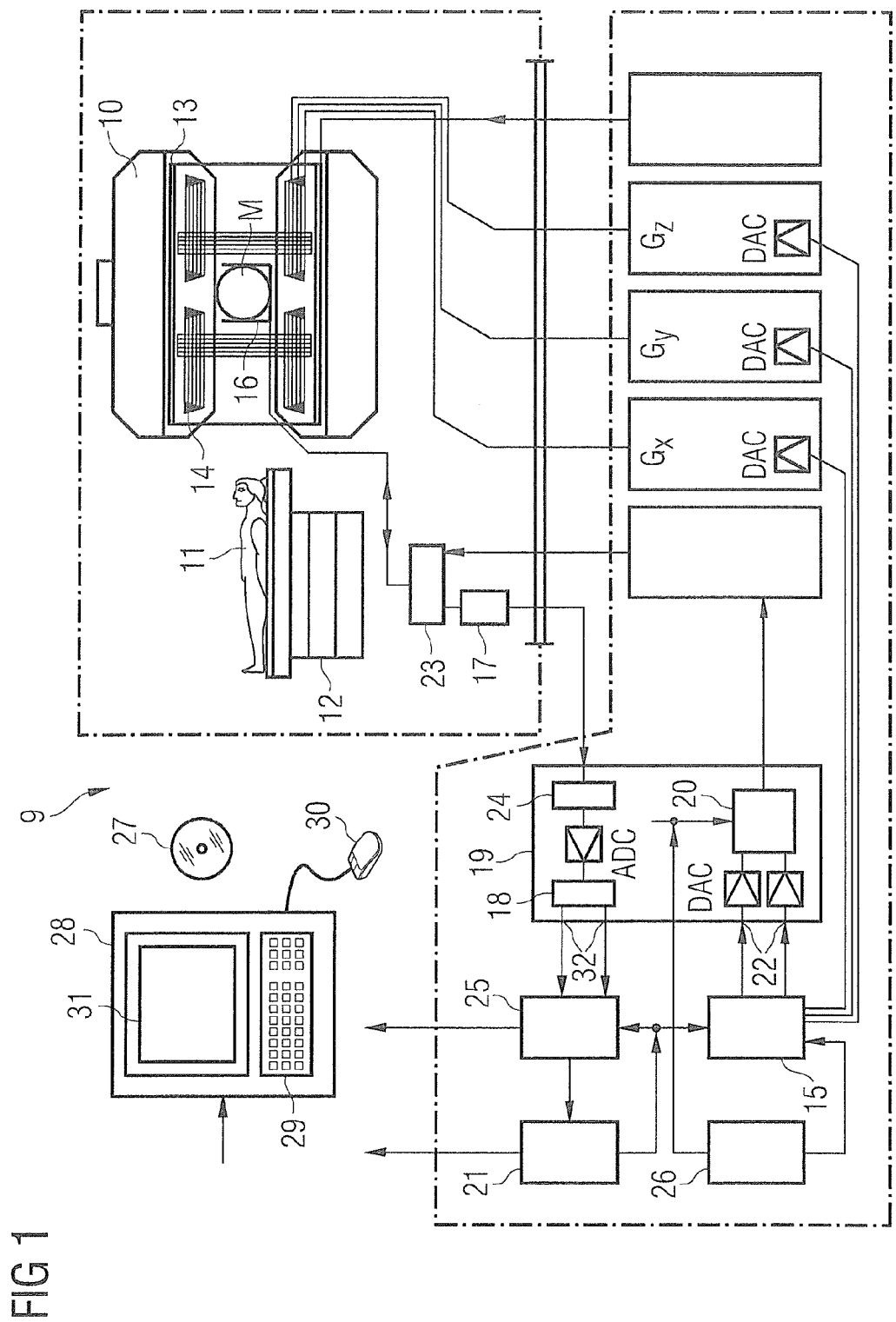
FIG. 1 schematically illustrates a magnetic resonance system according to the invention.

FIG. 1 is a schematic representation of a magnetic resonance system 9 (a magnetic resonance imaging or magnetic resonance tomography system). A basic field magnet 10 generates a temporally constant, strong magnetic field for polarization or alignment of the nuclear spins in an examination region of a subject 11 (for example a part of a human body that is to be examined) lying on a table 12 and moved into the magnetic resonance system 9. The high homogeneity of the basic magnetic field that is required for the magnetic resonance measurement (data acquisition) is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 13, if unwanted.

In the basic field magnet 10, a cylindrical gradient coil system 14 is used that has three sub-windings. Each sub-winding is supplied by an amplifier with current to generate a linear (also temporally variable) gradient field in the respective direction of the Cartesian coordinate system. The first sub-winding of the gradient field system 14 generates a gradient $G_x$ in the x-direction, the second sub-winding generates a gradient $G_y$ in the y-direction, and the third sub-winding generates a gradient $G_z$ in the z-direction. Each amplifier has a digital/analog converter DAC that is controlled by a sequence controller 15 for accurately-timed generation of gradient pulses.

Located within the gradient field system 14 is at least one radio-frequency antenna 16 that converts the radio-frequency pulses emitted by a radio-frequency power amplifier into an alternating magnetic field for excitation of the nuclei and alignment of the nuclear spins of the subject 11 to be examined, or of the region of the subject 11 that is to be examined. Each radio-frequency antenna 16 has one or more RF transmission coils and multiple RF reception coils or RF reception antennas in the form of an annular (advantageously linear or matrix-like) arrangement of component coils. The alternating field emanating from the precessing nuclear spins—i.e. normally the spin echo signals caused by a pulse sequence made up of one or more radio-frequency pulses and one or more gradient pulses—is also converted by the RF reception coils of the respective radio-frequency antenna 16 into a voltage (measurement signal), which is supplied via an amplifier 17 to a radio-frequency reception channel 18 of a radio-frequency system 19. The radio-frequency system 22 furthermore has a transmission channel 20 in which the radio-frequency pulses are generated for the excitation of the nuclear spins. The respective radio-frequency pulses are digitally represented in the sequence controller 15 as a series of complex numbers based on a pulse sequence predetermined by the apparatus computer 21. This number sequence is supplied as a real part and imaginary part to a digital/analog converter DAC in the radio-frequency system 19 via respective inputs 22, and from the digital/analog converter DAC to a transmission channel 20. In the transmission channel 20, the pulse sequences are modulated on a radio-frequency carrier signal whose base frequency corresponds to the resource frequency of the nuclear spins in the measurement volume.

The switching from transmission operation to reception operation takes place via a transmission/reception diplexer 23. The RF transmission coils of the radio-frequency antenna 16 radiates the radio-frequency pulses for excitation of the nuclear spins into the measurement volume M and scans resulting echo signals via the RF reception coils. The correspondingly acquired magnetic resonance signals are phase-sensitively demodulated to an intermediate frequency in the reception channel 24 (the first demodulator of the radio-frequency system 19) and digitized in an analog/digital converter ADC. This signal is further demodulated to a frequency of zero. The demodulation to a frequency of zero and the separation into real part and imaginary part occur in a second demodulator 18 after the digitization in the digital domain, which second demodulator 18 is connected with an output 32.

An MR image is reconstructed by an image computer 25 from the measurement data acquired in such a manner. The administration of the measurement data, the image data and the control programs takes place via the apparatus computer 21. Based on a specification with control programs, the sequence controller 15 monitors the generation of the respective desired pulse sequences and the corresponding scanning of k-space. The sequence controller 15 controls the accurately-timed switching of the gradients, the emission of the radio-frequency pulses with defined phase amplitude and the reception of the nuclear magnetic resonance signals. The time base for the radio-frequency system 19 and the sequence controller 15 is provided by a synthesizer 26. The selection of corresponding control programs to generate an MR image (which control programs are stored on a DVD 21, for example), as well as the presentation of the generated MR image, take place via a terminal 28 that includes a keyboard 29, a mouse 30 and a monitor 31.

Figure 2:
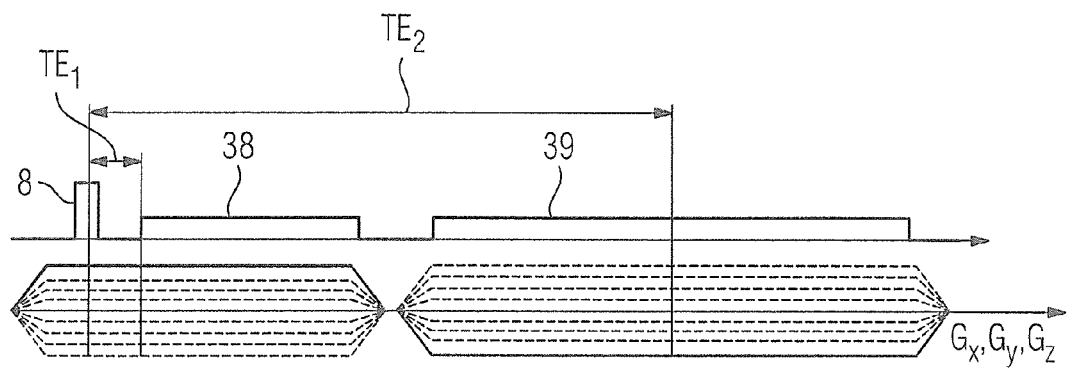
FIG. 2 schematically illustrates the acquisition of a double echo exposure with the PETRA sequence.

FIG. 2 is a schematic representation for the acquisition of a double echo exposure with the PETRA sequence. After acquisition of the first echo signal 38 after time TE1, the polarity of the gradients is reversed and the second echo signal 39 is acquired after time TE2. The echo signals are stored in the form of raw data sets.

While a half-projection of the center of k-space is acquired outwardly for the acquisition of the first raw data set, k-space is scanned completely in the acquisition of the second raw data set. The minimum repetition time thus increased by a factor of 2-3 in comparison to an acquisition with only one raw data set.

The number of repetitions corresponds to the number of half-projections that are required in order to completely scan k-space of the first raw data set. K-space of the second raw data set is thereby scanned twice as densely as is actually required.

If the number of repetitions is now reduced by 50%, for example, in this case k-space of the second raw data set 33 is scanned completely while k-space of the first raw data set 35 is scanned with only half of the density as necessary, which corresponds to a termination criterion after a certain number of repetitions. This procedure according to the invention then requires a model in order to complete the undersampled raw data set 35 on the basis of the completely scanned raw data set 33. This is achieved via compressed sensing algorithms, for example.

In the exemplary embodiment shown in FIG. 2, the gradients $G_x$, $G_y$, $G_z$ are switched before the RF excitation pulse 8 is radiated. This is characteristic of the described PETRA sequence and is not a requirement of the method according to the invention.

Figure 3:
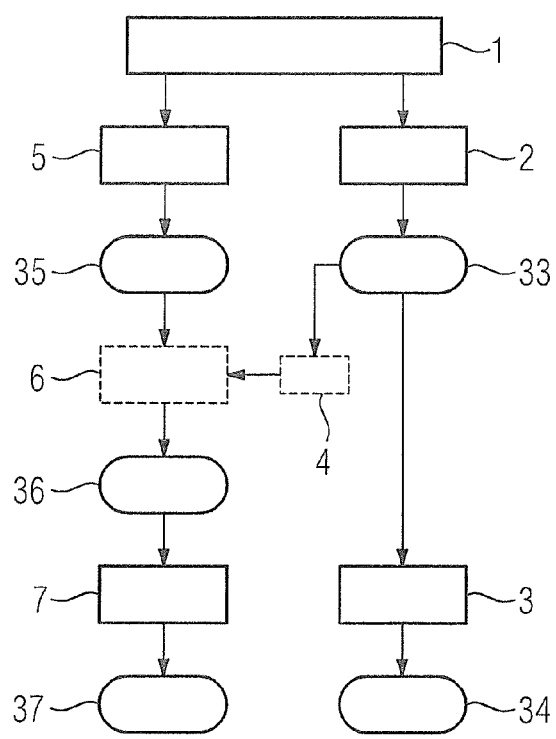
FIG. 3 is a flowchart of an embodiment of the method according to the invention.

FIG. 3 shows a flow diagram of a method according to the invention. In method step 1, the scan process is started and, during the method steps 5 and 2, k-space is scanned incompletely for the first raw data set and completely for the second raw data set. This results in an incomplete first raw data set 35 and a complete second raw data set 33.

In method step 4, the complete second raw data set 33 is used as a model to complete the undersampled first raw data set 35. In method step 6, this model is applied to the raw data set to complete the undersampled first raw data set 35. This results in a completed first raw data set 36. In method step 7, the first image data set 37 can therefore be reconstructed from the completed first raw data set 36.

The reconstruction of the second image data set 34 from the completely scanned second raw data set 33 takes place in method step 3.

Alternatively, a swapping of method steps 2 and 5 is also possible, meaning that k-space is scanned incompletely for the second raw data set and completely for the first raw data set. The image reconstruction subsequently takes place analogous to the procedure described above.

In summary, the invention concerns a method and a computer-readable storage medium for the creation of two raw data sets from double echo exposures of an imaging area located in a measurement volume of a magnetic resonance system by means of the magnetic resonance system, as well as a magnetic resonance system. Within the scope of the acquisition and the storage of two echo signals in the form of raw data sets at different times, k-space corresponding to the imaging area is either scanned completely for only the first raw data set and incompletely for the second raw data set, or completely only for the second raw data set and incompletely for the first raw data set. The completion of the incomplete raw data set takes place using a model on the basis of the completely scanned raw data set.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate two raw magnetic resonance (MR) data sets from double echo exposures in a magnetic resonance apparatus, comprising:

operating an MR data acquisition unit in order to expose an examination subject, located in a measurement volume of the MR data acquisition unit, to a double echo MR data acquisition sequence by, in said sequence:

(a) radiating a radio frequency excitation pulse that excites nuclear spins in an imaging area, located in the measurement volume, of the examination subject;

(b) after a first time following the radiated excitation pulse, acquiring a first echo signal arising from the excited nuclear spins and storing raw MR data representing said first echo signal in an electronic memory organized as k-space corresponding to said imaging area, as a first raw MR data set;

(c) after a second time, that is not equal to said first time, following the radiated excitation pulse, acquiring a second echo signal arising from the excited nuclear spins, and entering raw MR data representing said second echo signal into said electronic memory organized as k-space, as a second raw MR data set;

(d) repeating (a) through (c) while activating different magnetic gradient fields in respective repetitions that spatially encode each of said first and second echo signals, and terminating the repetitions upon reaching a maximum number of repetitions corresponding to a termination criterion, that cause k-space corresponding to the imaging area to be either filled completely for the first raw MR data set and incompletely for the second raw MR data set, or to be filled completely for the second raw MR data set and incompletely for the first raw MR data set, thereby resulting in a completely scanned raw MR data set and an incompletely scanned raw MR data set; and in a computerized processor, automatically completing the incomplete raw MR data set using a model based on the completely scanned raw MR data set and making the completely scanned raw MR data set and the completed raw MR data set available in electronic form, as respective data files.

2. A method as claimed in claim 1 wherein said incomplete raw MR data set, that is completed using said model, is a completed raw MR data set, and comprising, in said processor, reconstructing respective image data sets from the complete raw MR data set and the completed raw MR data set.

3. A method as claimed in claim 2 comprising, in said processor, calculating a difference image from the reconstructed image data sets.

4. A method as claimed in claim 3 comprising calculating said difference image by weighting one of said reconstructed image data sets dependent on a time constant that is applicable in said imaging area.

5. A method as claimed in claim 1 comprising, in step (d), repeating steps (a) through (c) to either fill k-space completely for said first raw MR data set and to fill only half of k-space for said second raw data set, or to fill k-space completely for said second raw MR data set and to fill only half of k-space for said first raw MR data set.

6. A method as claimed in claim 1 comprising, in step (a), radiating said radio frequency pulse with a transmission/reception system of said MR data acquisition unit operating in a transmission mode and, in step (b), acquiring said first and second echo signals with said transmission/reception system operating in a reception mode, and wherein said first time equals a minimum switching time of said transmission/reception device between said transmission mode and said reception mode.

7. A method as claimed in claim 1 comprising, in step (d), acquiring said first echo signal with said magnetic field gradients activated with a first polarity and acquiring said second echo signal with said magnetic field gradients activated with a second polarity that is opposite to said first polarity.

8. A method as claimed in claim 1 comprising, in step (d), entering said first raw MR data set into k-space along a radial trajectory proceeding only in a quadrant of k-space, and entering said second raw MR data set into k-space along a radial trajectory proceeding through an entirety of k-space.

9. A magnetic resonance (MR) apparatus comprising:

an MR data acquisition unit comprising a radio frequency (RF) transmission/reception unit and a gradient system, said MR data acquisition unit comprising a measurement volume in which an imaging area of an examination subject is located;

a control unit configured to operate the MR data acquisition unit in order to expose an examination subject, located in a measurement volume of the MR data acquisition unit, to a double echo MR data acquisition sequence by, in said sequence:

(a) operating the RF transmission/reception unit to radiate a radio frequency excitation pulse that excites nuclear spins in an imaging area, located in the measurement volume, of the examination subject;

(b) after a first time following the radiated excitation pulse, operate the gradient system to acquire a first echo signal arising from the excited nuclear spins and storing raw MR data representing said first echo signal in an electronic memory organized as k-space corresponding to said imaging area, as a first raw MR data set;

(c) after a second time, that is not equal to said first time, following the radiated excitation pulse, operate the gradient system to acquire a second echo signal arising from the excited nuclear spins, and entering raw MR data representing said second echo signal into said electronic memory organized as k-space, as a second raw MR data set;

(d) repeating (a) through (c) while activating different magnetic gradient fields in respective repetitions that spatially encode each of said first and second echo signals, and terminating the repetitions upon reaching a maximum number of repetitions corresponding to a termination criterion, that cause k-space corresponding to the imaging area to be either filled completely for the first raw MR data set and incompletely for the second raw MR data set, or to be filled completely for the second raw MR data set and incompletely for the first raw MR data set, thereby resulting in a completely scanned raw MR data set and an incompletely scanned raw MR data set; and a computerized processor configured to automatically complete the incomplete raw MR data set using a model based on the completely scanned raw MR data set, and to make the completely scanned raw MR data set and the completed raw MR data set available in electronic form, as respective data files.

10. A non-transitory, computer-readable data storage medium encoded with programming instructions, said data storage medium being loaded into a computerized control and evaluation system of a magnetic resonance (MR) apparatus that comprises an MR data acquisition unit having a measurement volume in which an imaging area of an examination subject is located, said programming instructions causing said computerized control and evaluation unit to:

operate the MR data acquisition unit in order to expose an examination subject, located in a measurement volume of the MR data acquisition unit, to a double echo MR data acquisition sequence by, in said sequence:

(a) radiating a radio frequency excitation pulse that excites nuclear spins in an imaging area, located in the measurement volume, of the examination subject;

(b) after a first time following the radiated excitation pulse, acquiring a first echo signal arising from the excited nuclear spins and storing raw MR data representing said first echo signal in an electronic memory organized as k-space corresponding to said imaging area, as a first raw MR data set;

(c) after a second time, that is not equal to said first time, following the radiated excitation pulse, acquiring a second echo signal arising from the excited nuclear spins, and entering raw MR data representing said second echo signal into said electronic memory organized as k-space, as a second raw MR data set;

(d) repeating (a) through (c) while activating different magnetic gradient fields in respective repetitions that spatially encode each of said first and second echo signals, and terminating the repetitions upon reaching a maximum number of repetitions corresponding to a termination criterion, that cause k-space corresponding to the imaging area to be either filled completely for the first raw MR data set and incompletely for the second raw MR data set, or to be filled completely for the second raw MR data set and incompletely for the first raw MR data set, thereby resulting in a completely scanned raw MR data set and an incompletely scanned raw MR data set; and complete the incomplete raw MR data set using a model based on the completely scanned raw MR data set and make the completely scanned raw MR data set and the completed raw MR data set available in electronic form, as respective data files.

* * * * *